(12) United States Patent
Han et al.

(10) Patent No.: US 10,012,851 B2
(45) Date of Patent: Jul. 3, 2018

(54) OPTICAL MODULATING DEVICE HAVING GATE STRUCTURE

(71) Applicants: SAMSUNG ELECTRONICS CO., LTD., Suwon-si (KR); CALIFORNIA INSTITUTE OF TECHNOLOGY, Pasadena, CA (US)

(72) Inventors: Seunghoon Han, Seoul (KR); Ruzan Sokhoyan, Pasadena, CA (US); Harry Atwater, Pasadena, CA (US); Ghazaleh Kafaie, Pasadena, CA (US); Ragip Pala, Pasadena, CA (US); Yu-Jung Lu, Pasadena, CA (US); Ho Wai Lee, Pasadena, CA (US); Yao-Wei Huang, Pasadena, CA (US); Krishnan Thyagarajan, Pasadena, CA (US)

(73) Assignees: SAMSUNG ELECTRONICS CO., LTD., Suwon-si (KR); CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 15/214,919

(22) Filed: Jul. 20, 2016

(65) Prior Publication Data
US 2017/0031183 A1    Feb. 2, 2017

Related U.S. Application Data

(60) Provisional application No. 62/197,331, filed on Jul. 27, 2015.

(30) Foreign Application Priority Data

Jan. 21, 2016   (KR) .................. 10-2016-0007548

(51) Int. Cl.
  *G02F 1/03*   (2006.01)
  *G02F 1/07*   (2006.01)
  (Continued)

(52) U.S. Cl.
  CPC .......... *G02F 1/0121* (2013.01); *G02B 5/008* (2013.01); *G02F 1/0102* (2013.01); *H01L 33/06* (2013.01); *H01L 33/44* (2013.01)

(58) Field of Classification Search
  CPC ..... G02F 1/0121; G02F 1/0102; G02B 5/008; H01L 33/44; H01L 33/06
  (Continued)

(56) References Cited

U.S. PATENT DOCUMENTS 9,256,113 B2    2/2016   Han et al.
2013/0215483 A1  8/2013   Han et al.
(Continued)

FOREIGN PATENT DOCUMENTS

JP    2008232853 A    10/2008
JP    2014508379 A    4/2014
JP    5664657 B2    2/2015

OTHER PUBLICATIONS

Esteban Bermudez Urena et al., "Excitation enhancement of a quantum dot coupled to a plasmonic antenna", 2012, DOI: 10.1002/adma.201202783, Total 18 pages.
(Continued)

*Primary Examiner* — Tuyen Tra
(74) *Attorney, Agent, or Firm* — Sughrue Mion, PLLC (57) ABSTRACT

An optical modulating device includes a permittivity change layer having a variable permittivity, a dielectric layer disposed on the permittivity change layer, a nanoantenna disposed on the dielectric layer, and a light-emitting structure disposed adjacent to the permittivity change layer.

21 Claims, 9 Drawing Sheets

(51) Int. Cl.
    *G02F 1/01*         (2006.01)
    *H01L 33/06*      (2010.01)
    *G02B 5/00*        (2006.01)
    *H01L 33/44*      (2010.01)

(58) Field of Classification Search
    USPC .................... 359/244, 241, 240, 238, 237
    See application file for complete search history.

(56) References Cited

U.S. PATENT DOCUMENTS

| | | |
|---|---|---|
| 2013/0286633 A1 | 10/2013 | Rodriguez et al. |
| 2013/0308102 A1 | 11/2013 | Natsumeda et al. |
| 2016/0018675 A1* | 1/2016 | Kim ................ G02F 1/0126 359/244 |
| 2016/0223723 A1 | 8/2016 | Han et al. |
| 2017/0227797 A1* | 8/2017 | Long ................ G02F 1/0136 |

OTHER PUBLICATIONS

Yao-Wei Huang et al., "Gate-tunable conducting oxide metasurfaces", 2015, Total 13 pages.

Ho W. Lee et al., "Nanoscale Conducting Oxide PlasMOStor", Nano Letters, 2014 American Chemical Society, vol. 14, pp. 6463-6468.

\* cited by examiner

OPTICAL MODULATING DEVICE HAVING GATE STRUCTURE

CROSS-REFERENCE TO RELATED APPLICATIONS

This application claims the benefit of U.S. Provisional Patent Application No. 62/197,331, filed on Jul. 27, 2015 in the U.S. Patent and Trademark Office, and priority from Korean Patent Application No. 10-2016-0007548, filed on Jan. 21, 2016 in the Korean Intellectual Property Office, the disclosures of which are incorporated herein by reference in their entireties.

BACKGROUND

1. Field

Apparatuses consistent with exemplary embodiments relate to optical devices for modulating light.

2. Description of the Related Art

Optical devices for modulating transmittance/reflection, polarization, phase, intensity, optical path, etc. of incident light are used in various optical apparatuses. Also, optical modulators of various structures are provided to control the properties described above in an optical system in a desired manner.

For example, structures such as liquid crystals having optical anisotropy, a microelectromechanical system (MEMS) using minute mechanical motion of an optical shielding/reflecting element, etc. are widely implemented in general optical modulators. These general optical modulators have a slow operational response rate of several μs, due to characteristics of driving methods thereof.

There have been attempts to implement a nanoantenna using surface plasmon resonance occurring at a boundary between a metal layer and a dielectric layer, in optical devices.

SUMMARY

Exemplary embodiments may address at least the above problems and/or disadvantages and other disadvantages not described above. Also, the exemplary embodiments are not required to overcome the disadvantages described above, and may not overcome any of the problems described above.

Exemplary embodiments provide optical devices for modulating light.

According to an aspect of an exemplary embodiment, there is provided an optical modulating device including a permittivity change layer having a variable permittivity, a dielectric layer disposed on the permittivity change layer, a nanoantenna disposed on the dielectric layer, and a light-emitting structure disposed adjacent to the permittivity change layer.

The light-emitting structure may be configured to emit light having a greater wavelength than light incident on the light-emitting structure in response to the incident light, as an excitation source.

The light-emitting structure may include light-emitting particles.

The optical modulating device may further include an insulating material layer on which the permittivity change layer is disposed, the light-emitting particles being embedded in the insulating material layer.

The light-emitting structure may include a semiconductor quantum well or a semiconductor PN junction.

The optical modulating device may further include a metal layer on which the light-emitting structure, the permittivity change layer, the dielectric layer, and the nanoantenna are sequentially disposed.

The optical modulating device may further include a voltage-applier configured to apply a voltage between the permittivity change layer and the nanoantenna.

The permittivity change layer may include an active area in which a carrier concentration changes based on the applied voltage.

The permittivity change layer may include a transparent conductive oxide.

An optical apparatus may include the optical modulating device.

According to an aspect of another exemplary embodiment, there is provided an optical modulating device including a substrate, nanoantennas disposed on the substrate and spaced apart from one another, a dielectric layer disposed on the nanoantennas, a permittivity change layer disposed on the dielectric layer and having a variable permittivity, and a light-emitting structure disposed on the permittivity change layer and between the nanoantennas.

The light-emitting structure may be configured to emit light having a greater wavelength than light incident on the light-emitting structure in response to the incident light, as an excitation source.

The light-emitting structure may include light-emitting particles.

The optical modulating device may further include an insulating material layer disposed on the permittivity change layer, the light-emitting particles being embedded in the insulating material layer.

The light-emitting structure may include a semiconductor quantum well or a semiconductor PN junction.

The optical modulating device may further include an insulating material layer covering the permittivity change layer and the light-emitting structure.

The optical modulating device may further include voltage-appliers configured to apply respective voltages between the respective nanoantennas and the permittivity change layer.

The permittivity change layer may include a transparent conductive oxide.

An optical apparatus may include the optical modulating device, and a backlight configured to provide light to the optical modulating device.

The optical apparatus may further include a driving circuit disposed on the substrate and configured to control voltages applied to the respective nanoantennas.

BRIEF DESCRIPTION OF THE DRAWINGS

The above and/or other aspects will be more apparent by describing exemplary embodiments with reference to the accompanying drawings, in which.

DETAILED DESCRIPTION

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions may not be described in detail because they would obscure the description with unnecessary detail.

In addition, the terms such as "unit," "-er (-or)," and "module" described in the specification refer to an element for performing at least one function or operation, and may be implemented in hardware, software, or the combination of hardware and software.

Figure 1:
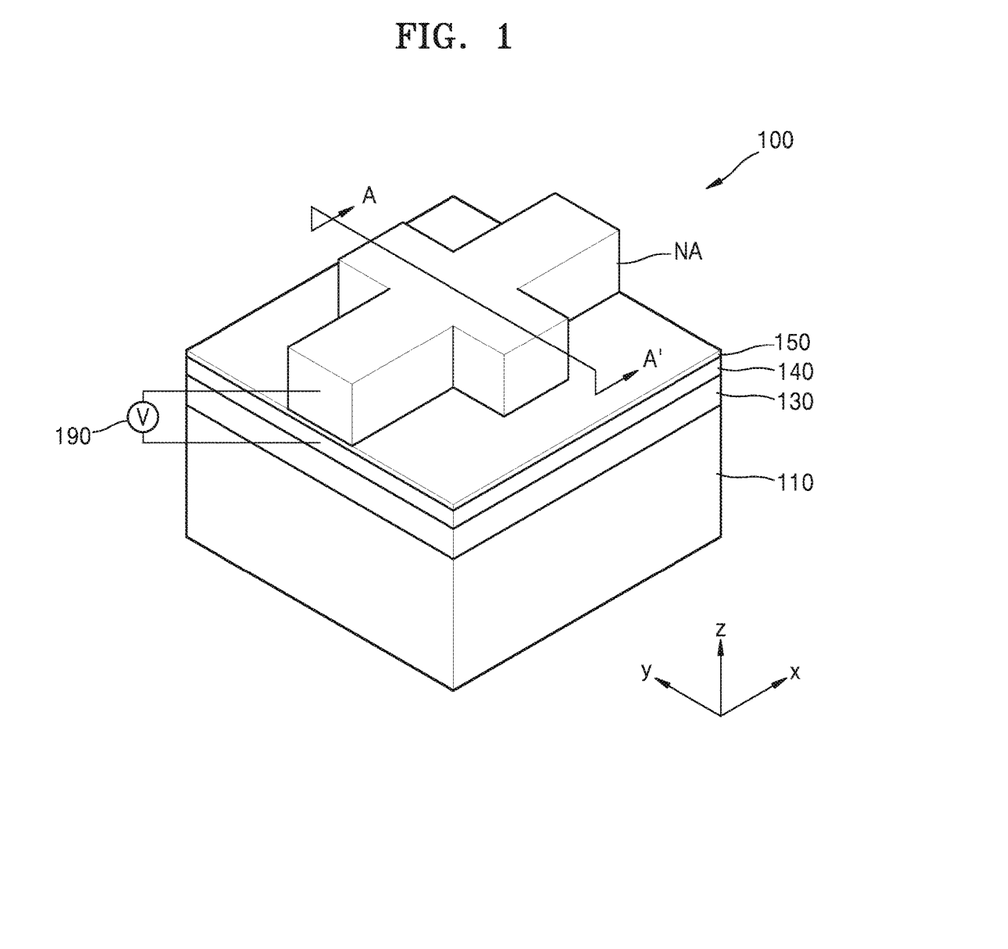
FIG. 1 is a perspective view of a schematic structure of an optical modulating device according to an exemplary embodiment.
Figure 2:
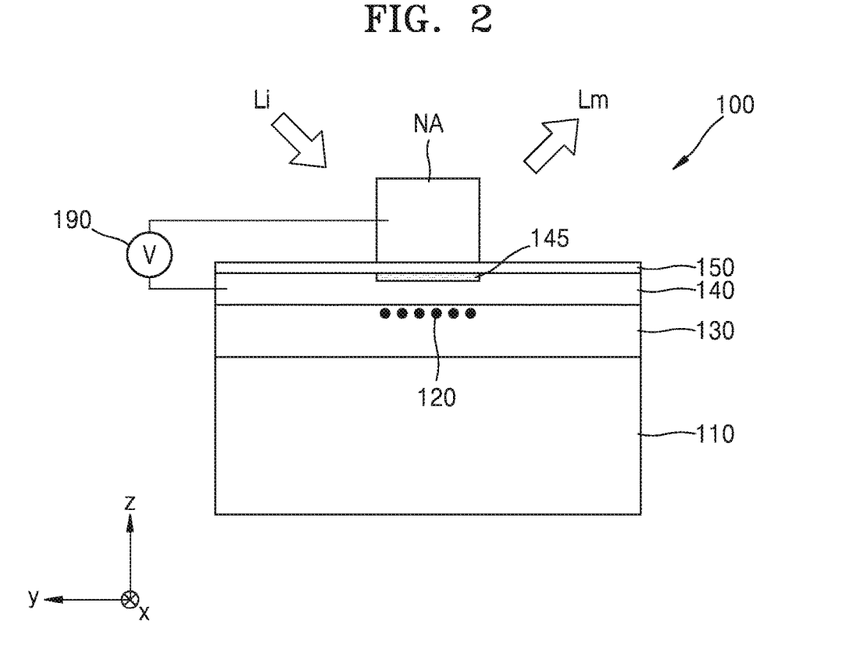
FIG. 2 is a cross-sectional view taken along a line A-A' of the optical modulating device of FIG. 1.

FIG. 1 is a perspective view of a schematic structure of an optical modulating device 100 according to an exemplary embodiment. FIG. 2 is a cross-sectional view taken along a line A-A' of the optical modulating device 100 of FIG. 1.

Referring to FIGS. 1 and 2, the optical modulating device 100 includes a permittivity change layer 140 having a variable permittivity, a dielectric layer 150 disposed on the permittivity change layer 140, a nanoantenna NA disposed on the dielectric layer 150, and a light-emitting structure 120 disposed adjacent to the permittivity change layer 140.

The optical modulating device 100 further includes an insulating material layer 130, and the light-emitting structure 120 is embedded in the insulating material layer 130 and is disposed under the permittivity change layer 140.

Also, the optical modulating device 100 further includes a metal layer 110 disposed under the permittivity change layer 140. On the metal layer 110, the insulating material layer 130 in which the light-emitting structure 120 is embedded, the permittivity change layer 140, the dielectric layer 150, and the nanoantenna NA are sequentially disposed.

The permittivity change layer 140 may include a material having an optical property that changes in response to an external signal. The external signal may be an electrical signal. The permittivity change layer 140 may include transparent conductive oxide (TCO), such as indium tin oxide (ITO), indium zinc oxide (IZO), aluminum zinc oxide (AZO), gallium zinc oxide (GZO), aluminum gallium zinc oxide (AGZO), and gallium indium zinc oxide (GIZO). Also, the permittivity change layer 140 may include transition metal nitride, such as TiN, ZrN, HfN, and TaN. In addition, the permittivity change layer 140 may include an electro-optic material, a valid permittivity of which changes when an electrical signal is applied, such as $LiNbO_3$, $LiTaO_3$, potassium tantalate niobate (KTN), and lead zirconate titanate (PZT). Further, the permittivity change layer 140 may include various polymer materials having an electro-optic property.

A voltage applier 190 for applying a voltage between the permittivity change layer 140 and the nanoantenna NA is included in the optical modulating device 100. Hereinafter, it will be described that the permittivity change layer 140 includes a material, a permittivity of which changes according to an electrical signal. However, the permittivity change layer 140 is not limited thereto. For example, the permittivity change layer 140 may include a material, a permittivity of which changes due to phase transition occurring at a temperature that is equal to or higher than a predetermined temperature when heat is applied thereto. For example, the permittivity change layer 140 may include $VO_2$, $VO_2O_3$, EuO, MnO, CoO, $CoO_2$, $LiCoO_2$, $Ca_2RuO_4$, or the like.

The nanoantenna NA includes a conductive material, is an artificial structure having a shape with dimension of a sub-wavelength, and intensely gathers light in a predetermined wavelength band. Here, the sub-wavelength denotes a wavelength of a smaller dimension than an operation wavelength of the nanoantenna NA, that is, the predetermined wavelength described above. Any dimension forming a shape of the nanoantenna NA, for example, at least one among a thickness, a width, a height, and a gap between the nanoantennas NAs may correspond to the dimension of the sub-wavelength.

The above-described function of the nanoantenna NA is known to be possible by surface plasmon resonance occurring at a boundary between a metal material and a dielectric material, and a resonance wavelength varies depending on a detailed shape of the nanoantenna NA. Hereinafter, the nanoantenna NA, the dielectric layer 150, and an interface at which surface plasmon resonance occurs will be called a "metasurface."

It is illustrated that a cross-sectional shape of the nanoantenna NA is cross-shaped. However, it is not limited thereto. For example, the cross-sectional shape of the nanoantenna NA may be circle-shaped, star-shaped, or polygon-shaped.

The conductive material included in the nanoantenna NA may include a metal material having high conductivity, at which surface plasmon excitation may occur. For example, the conductive material may include at least one selected from Cu, Al, Ni, Fe, Co, Zn, Ti, Ru, Rh, Pd, Pt, Ag, Os, Ir, Pt, and Au, or may include an alloy including any one among Cu, Al, Ni, Fe, Co, Zn, Ti, Ru, Rh, Pd, Pt, Ag, Os, Ir, Pt, and Au. Also, the conductive material may include a two-dimensional material having high conductivity, such as graphene, or conductive oxide.

The dielectric layer 150 may include a material, such as $Al_2O_3$, $HfO_2$, MgO, or $SiO_2$.

The light-emitting structure 120 may include various materials having photoluminescence. For example, the light-emitting structure 120 may include, as light-emitting particles, any one among rare earth ions, quantum dots, plasmonic nanoparticles, dielectric nanoparticles, and semiconductor nanoparticles. For example, the light-emitting particles may include any one among Si-based nanocrystals, groups II-VI based compound semiconductor nanocrystals, groups III-V based compound semiconductor nanocrystals, groups IV-VI based compound semiconductor nanocrystals, and a mixture thereof. The groups II-VI based compound semiconductor nanocrystals may include any one selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, and HgZnSTe. The groups III-V based compound semiconductor nanocrystals may include any one selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. The groups IV-VI based compound semiconductor nanocrystals may include SbTe.

FIG. 2 illustrates the light-emitting structure 120 as the light-emitting particles. However, the light-emitting structure 120 is not limited thereto, and may include a PN junction structure or a quantum well structure.

The metal layer 110 may function as a mirror layer for reflecting light. According to the provision of the metal layer 110, directions of incident light (Li), and modulated light (Lm) are formed, as illustrated in FIG. 2. The metal layer 110 may include various metal materials capable of performing this function. For example, the metal layer 110 may include at least one selected from Cu, Al, Ni, Fe, Co, Zn, Ti, Ru, Rh, Pd, Pt, Ag, Os, Ir, Pt, and Au.

When the metal layer 110 is provided, a voltage may be applied between the nanoantenna NA and the metal layer 110, according to necessity.

Referring to FIG. 2, the permittivity change layer 140 includes an active area 145, in which a carrier concentration changes according to whether or not a voltage is applied between the permittivity change layer 140 and the nanoantenna NA. The active area 145 is formed in the permittivity change layer 140 to be adjacent to the dielectric layer 150, and has the carrier concentration that changes according to the applied voltage. According to the carrier concentration formed in the active area 145, a shape of modulation of light that is incident in the light modulating device 100 may be adjusted. In this respect, the active area 145 may be understood as a gate adjusting and controlling the optical modulation performance of the nanoantenna NA.

A permittivity of the permittivity change layer 140 varies according to a wavelength. Relative permittivity ($\in_r$) to vacuum permittivity ($\in_0$) is called a dielectric constant, and the real part of the dielectric constant of the permittivity change layer 140 is 0 in a wavelength band.

A wavelength band in which the real part of the dielectric constant has a value that is 0 or very adjacent to 0 is called an epsilon near zero (ENZ) wavelength band. A dielectric constant of most of materials is represented as a function of a wavelength, and may be represented as a complex number. A vacuum dielectric constant is 1, and in the case of a general dielectric material, the real part of the dielectric constant is a positive number that is greater than 1. In the case of a metal, the real part of the dielectric constant may be a negative number. In most wavelength bands, the dielectric constant of most of materials has a value that is greater than 1, while in a wavelength band, the real part of the dielectric constant may have a value that is 0.

When the real part of the dielectric constant has a value that is 0 or is very adjacent to 0, it is known that an optical property appears, and the optical modulating device 100 according to an exemplary embodiment may set an operational wavelength band as an area including the ENZ wavelength band of the permittivity change layer 140. That is, by setting a resonance wavelength band of the nanoantenna NA similar to the ENZ wavelength band of the permittivity change layer 140, a range within which the optical modulation performance may be adjusted by an applied voltage may be increased.

The ENZ wavelength band of the permittivity change layer 140 varies according to a carrier concentration formed in the active area 145. To utilize the ENZ wavelength band of the permittivity change layer 140, a range of a voltage in which the voltage applier 190 applies between the permittivity change layer 140 and the nanoatenna NA may include a voltage value with which a resonance wavelength of a plasmonic nanoantenna layer 170 is consistent with a wavelength in which the permittivity change layer 140 has an ENZ property.

The light-emitting structure 120 may emit, as an excitation source, light having a greater wavelength than incident light, by being excited by the incident light. A dipole emitter formed in the light-emitting structure 120 by excitation light is coupled to a gap plasmon mode in a resonance wavelength band of the metasurface. That is, electromagnetic energy radiated by the dipole emitter is transmitted to a far-field via a resonance mode of the nanoantenna NA, and radiation power is related to local density of optical states (LDOS). The LDOS is related to a decay rate of the dipole emitter, and may be represented as the number of photons emitted per unit time. As the LDOS increases, the radiation power increases. The LDOS may be controlled by a change of permittivity of the permittivity change layer 140. A complex refractivity change locally occurring in the permittivity change layer 140 contributes to control of the LDOS. That is, it is analyzed that a degree of the coupling of the dipole emitter and the plasmon may be adjusted depending on a degree of accumulation or depletion of charges in the active area 145 formed in the permittivity change layer 140. The coupling efficiency may be adjusted according to an applied voltage. Also, via this, a relative coupling efficiency of the dipole emitter and the nanoantenna NA may be adjusted. Also, when the nanoantenna NA has directivity, light may be adjusted to be emitted in a desired direction.

As described above, the incident light (Li) to the optical modulating device 100 is emitted as modulated light (Lm), and a wavelength, an intensity, a phase, a direction, etc. of the modulated light (Lm) may be adjusted according to the described elements.

Figure 3:
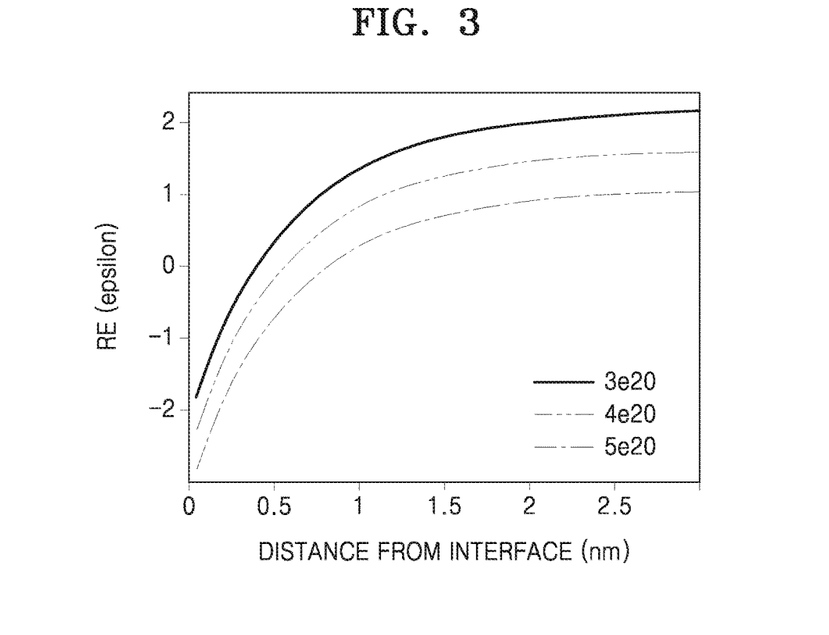
FIG. 3 is a graph obtained by computer simulation with respect to a change of permittivity in the optical modulating device of FIG. 1, according to a carrier concentration of a permittivity change layer.

FIG. 3 is a graph obtained by computer simulation with respect to a change of permittivity according to a carrier concentration of the permittivity change layer 140, in the optical modulating device 100 of FIG. 1.

In the graph, a horizontal axis indicates a location in the permittivity change layer 140 as a distance from a boundary surface between the permittivity change layer 140 and the dielectric layer 150. A vertical axis indicates a value of a real number of a permittivity RE.

A unit of the carrier concentration is $cm^{-3}$, and the graph shows a change in the real part of the permittivity based on three types of carrier concentrations.

Figure 4:
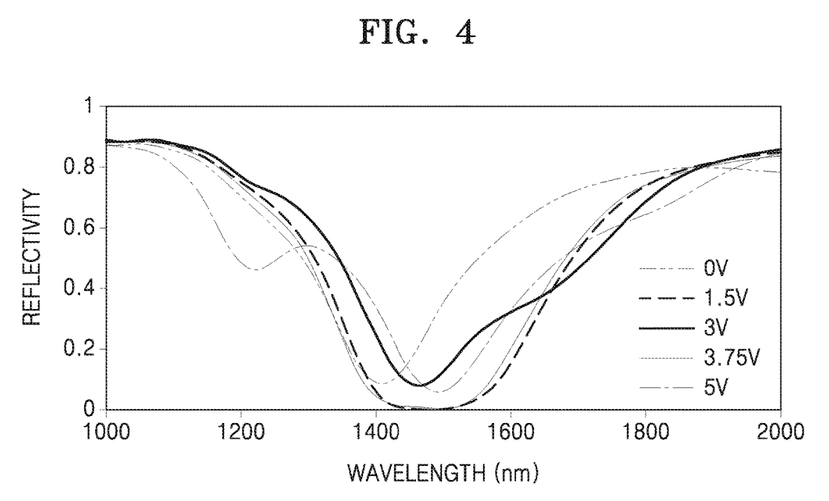
FIG. 4 is a graph obtained by computer simulation with respect to reflectivity in the optical modulating device of FIG. 1, according to a voltage applied to a permittivity change layer and wavelengths of incident light.

FIG. 4 is a graph obtained by computer simulation with respect to reflectivity according to a voltage applied to the permittivity change layer 140 and wavelengths of incident light, in the optical modulating device 100 of FIG. 1.

A wavelength band in which the reflectivity becomes the smallest is a resonance wavelength band, and it is shown that the reflectivity changes and the resonance wavelength band is adjusted, according to the applied voltage.

Figure 5:
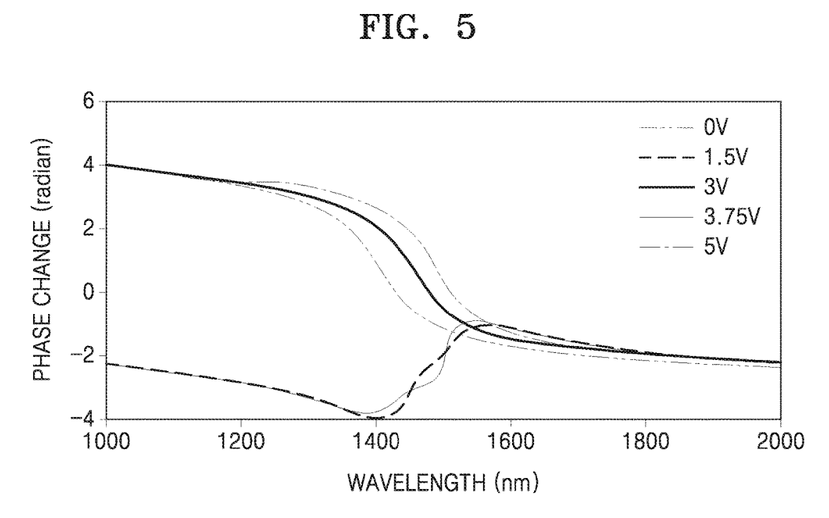
FIG. 5 is a graph obtained by computer simulation with respect to a phase change in the optical modulating device of FIG. 1, according to a voltage applied to a permittivity change layer and wavelengths of incident light.

FIG. 5 is a graph obtained by computer simulation with respect to a phase change in the optical modulating device 100 of FIG. 1, according to a voltage applied to the permittivity change layer 140 and wavelengths of incident light It is shown in the graph that the phase change is adjusted according to adjustment of the applied voltage, and the phase change within a range that is proximate to about $2\pi$ is possible.

Figure 6:
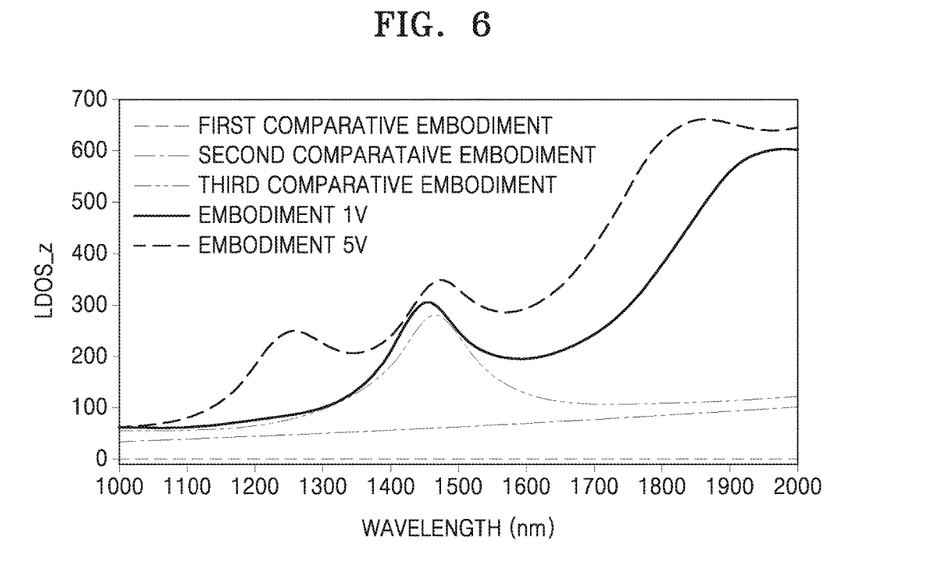
FIG. 6 is a graph obtained by computer simulation with respect to a change of local density of optical states (LDOS) in the optical modulating device of FIG. 1, according to a voltage applied to a permittivity change layer and wavelengths of incident light, which is shown in comparison with comparative exemplary embodiments.

FIG. 6 is a graph obtained by computer simulation respect to a change of LDOS according to a voltage applied to the permittivity change layer 140 and wavelengths of incident light, in the optical modulating device 100 of FIG. 1, shown in comparison with comparative exemplary embodiments.

In the graph, an exemplary embodiment 1V is the case in which the applied voltage is 1V, an exemplary embodiment 5V is the case in which the applied voltage is 5V. A first comparative exemplary embodiment has a structure, in which only the nanoantenna NA and the light-emitting structure 120 are provided in the optical modulating device 100 of FIG. 1, a second comparative exemplary embodiment includes only a lower metal layer 11 and the light-emitting structure 120 in the optical modulating device 100, and a third comparative exemplary embodiment has a structure in which the permittivity change layer 140 is not provided in the optical modulating device 100.

In the graph, a vertical axis indicates an LDOS, a subscript z denotes that a dipole direction is computer simulated as a z direction.

Referring to the graph, it is shown that a resonance wavelength band is formed and a level of the LDOS increases, when a metasurface structure is provided. It is also shown that the LDOS may be changed according to adjustment of a complex refractivity by the applied voltage, in exemplary embodiments in which the permittivity change layer 140 is provided.

Figure 7:
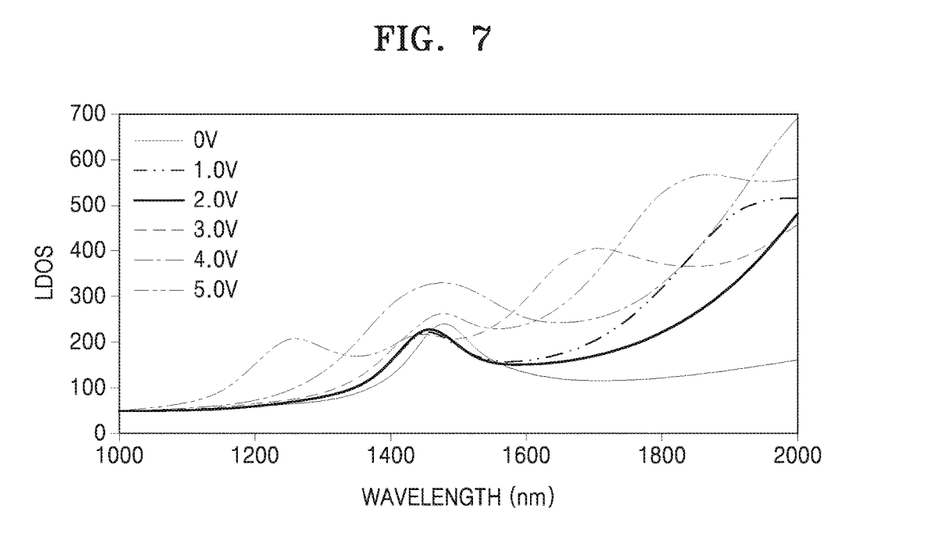
FIG. 7 is a graph obtained by computer simulation with respect to a change of LDOS in the optical modulating device of FIG. 1, according to a voltage applied to a permittivity change layer and wavelengths of incident light.

FIG. 7 is a graph obtained by computer simulation with respect to a change of LDOS according to a voltage applied to the permittivity change layer 140 and wavelengths of incident light, in the optical modulating device 100 of FIG. 1.

The graph shows that the LDOS may be adjusted by varying the voltage applied to the permittivity change layer 140.

Figure 8:
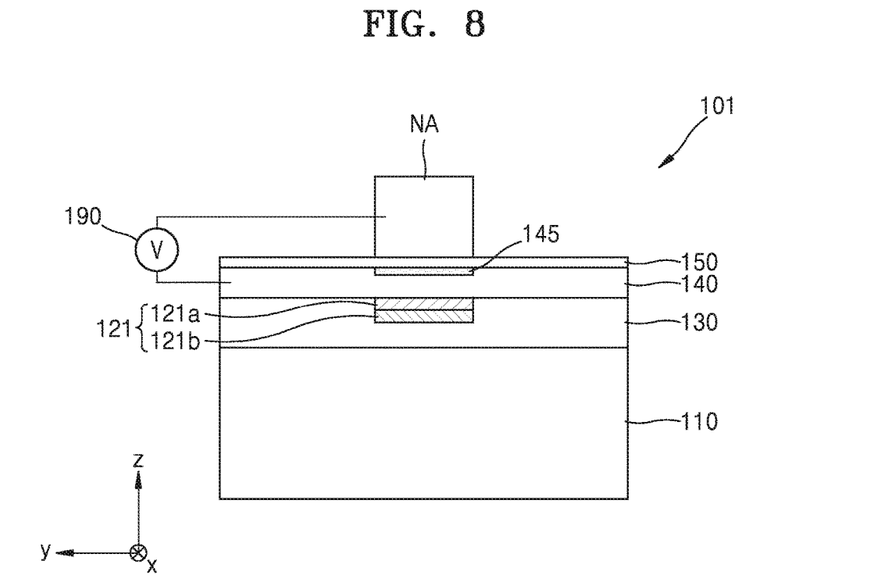
FIG. 8 is a cross-sectional view of a schematic structure of an optical modulating device according to another exemplary embodiment.

FIG. 8 is a cross-sectional view of a schematic structure of an optical modulating device 101 according to another exemplary embodiment.

The optical modulating device 101 differs from the optical modulating device 100 of FIG. 1 in that the optical modulating device 101 implements a PN junction structure as a light-emitting structure 121.

The optical modulating device 101 includes the metal layer 110, the insulating material layer 130 in which the light-emitting structure 121 is included, the permittivity change layer 140 in which the active area 145 is included, the dielectric layer 150, and the nanoantenna NA.

The light-emitting structure 121 includes the semiconductor PN junction structure in which a p-type semiconductor layer 121a and an n-type semiconductor layer 121b are adjoined to each other. An emitter is formed when electrons and holes are combined at an interface of the PN junction by incident optical energy. Coupling of the emitter and a surface plasmon is controlled by a change of complex permittivity of the permittivity change layer 140 and an LDOS is adjusted.

Figure 9:
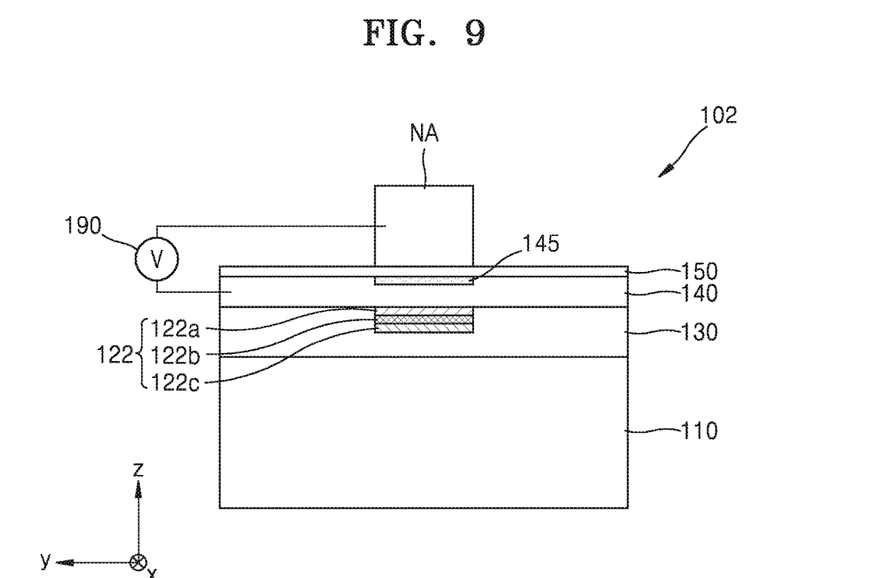
FIG. 9 is a cross-sectional view of a schematic structure of an optical modulating device according to another exemplary embodiment.

FIG. 9 is a cross-sectional view of a schematic structure of an optical modulating device 102 according to another exemplary embodiment.

The optical modulating device 102 differs from the optical modulating device 100 of FIG. 1 in that the optical modulating device 102 implements a semiconductor quantum well structure as a light-emitting structure 122.

The optical modulating device 102 includes the metal layer 110, the insulating material layer 130 in which the light-emitting structure 122 is included, the permittivity change layer 140 in which the active area 145 is included, the dielectric layer 150, and the nanoantenna NA.

The light-emitting structure 122 may include a plurality of semiconductor layers having different thicknesses and compositions. For example, the light-emitting structure 122 includes a structure in which a well layer 122b is interposed between two barrier layers 122a and 122c. In FIG. 9, it is illustrated as a single quantum well (SOW) structure in which the well layer 122b is interposed between the two barrier layers 122a and 122c. However, it is only exemplary, and the light-emitting structure 122 is not limited thereto. The light-emitting structure 122 may include a multi-quantum well (MOW) structure in which barrier layers and well layers are repeatedly stacked. The well layer 122b, and the barrier layers 122a and 122c may include group III nitride semiconductor materials. For example, the barrier layers 122a and 122c may include InGaN or GaN, and the well layer 122b may include InGaN. However, it is not limited thereto. The well layer 122b includes a material having a less energy band gap than a material of the barrier layers 122a and 122c. The barrier layers 122a and 122c may be doped with an n-type or p-type material, and it is also possible that both of the well layer 122b and the barrier layers 122a and 122c are doped.

Electrons and holes are generated when incident optical energy is absorbed in the barrier layers 122a and 122c. The generated electrons and holes move to the well layer 122b, are confined in the well layer 122b and combined with each other. The combination of the electrons and holes occurring in the well layer 122b serves a as an emitter. Coupling of the emitter and a surface plasmon is controlled by a change of complex permittivity of the permittivity change layer 140 and an LDOS is adjusted. When the LDOS increases, an amount of light emission increases, and when the LDOS decreases, an amount of light emission decreases.

Figure 10:
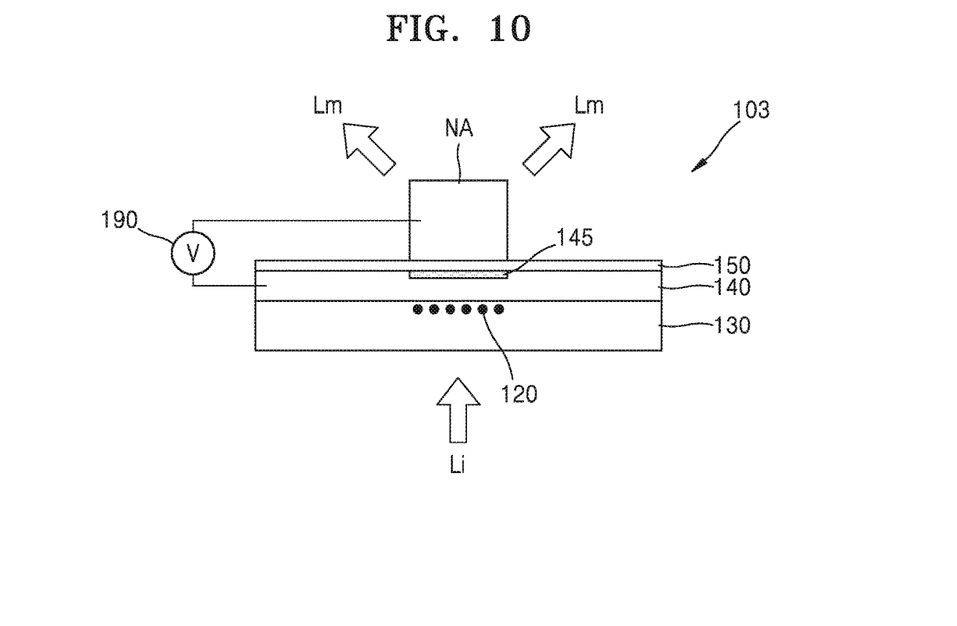
FIG. 10 is a cross-sectional view of a schematic structure of an optical modulating device according to another exemplary embodiment.

FIG. 10 is a cross-sectional view of a schematic structure of an optical modulating device 103 according to another exemplary embodiment.

The optical modulating device 103 has a transmittance-type structure. That is, incident light (Li) is transmitted through the optical modulating device 103 and is emitted as modulated light (Lm).

The optical modulating device 103 includes the insulating material layer 130 in which the light-emitting structure 120 is embedded, the permittivity change layer 140 in which the active area 145 is included, the dielectric layer 150, and the nanoantenna NA. The optical modulating device 103 differs from the optical modulating device 100 of FIG. 1 in that optical modulating device 103 does not include the metal layer 110 of FIG. 1.

Figure 11:
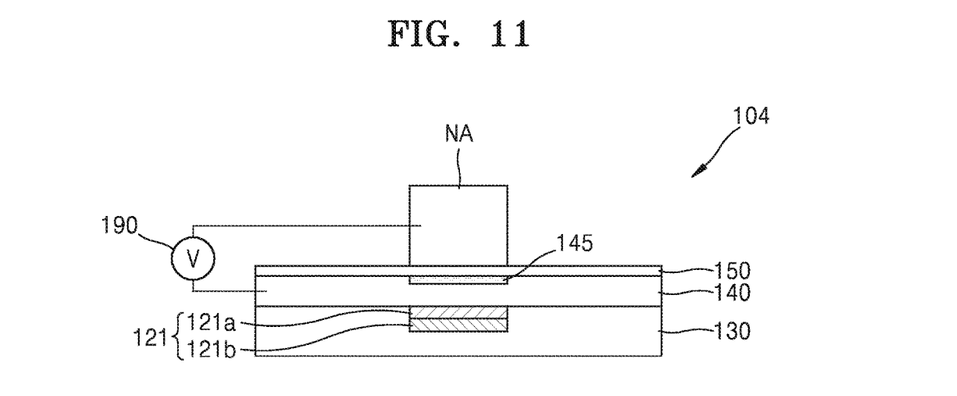
FIG. 11 is a cross-sectional view of a schematic structure of an optical modulating device according to another exemplary embodiment.

FIG. 11 is a cross-sectional view of a schematic structure of an optical modulating device 104 according to another exemplary embodiment.

The optical modulating device 104 is also the transmittance type as the optical modulating device 103 of FIG. 10. However, the optical modulating device 104 differs from the optical modulating device 103 of FIG. 10 in that the optical modulating device 104 implements a semiconductor PN junction structure as the light-emitting structure 121.

Figure 12:
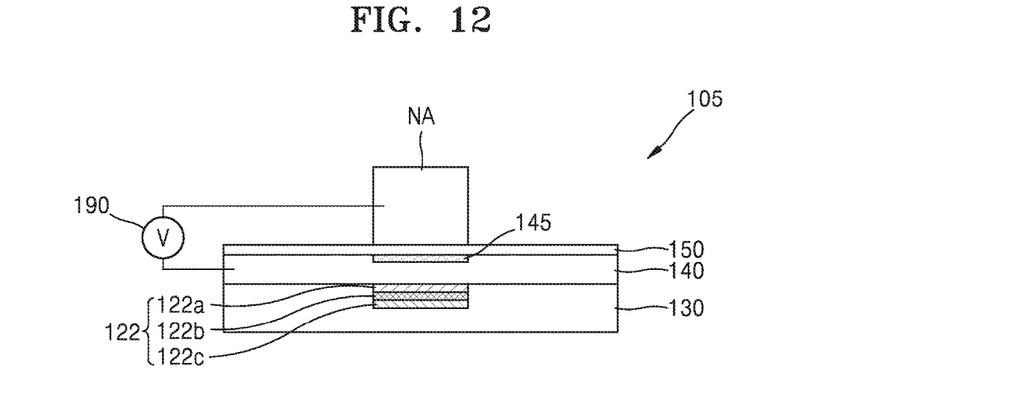
FIG. 12 is a cross-sectional view of a schematic structure of an optical modulating device according to another exemplary embodiment.

FIG. 12 is a cross-sectional view of a schematic structure of an optical modulating device 105 according to another exemplary embodiment.

The optical modulating device 105 is also the transmittance type as the optical modulating device 103 of FIG. 10. However, the optical modulating device 105 differs from the optical modulating device 103 of FIG. 10 in that the optical modulating device 105 implements a semiconductor quantum well structure as the light-emitting structure 122.

Figure 13:
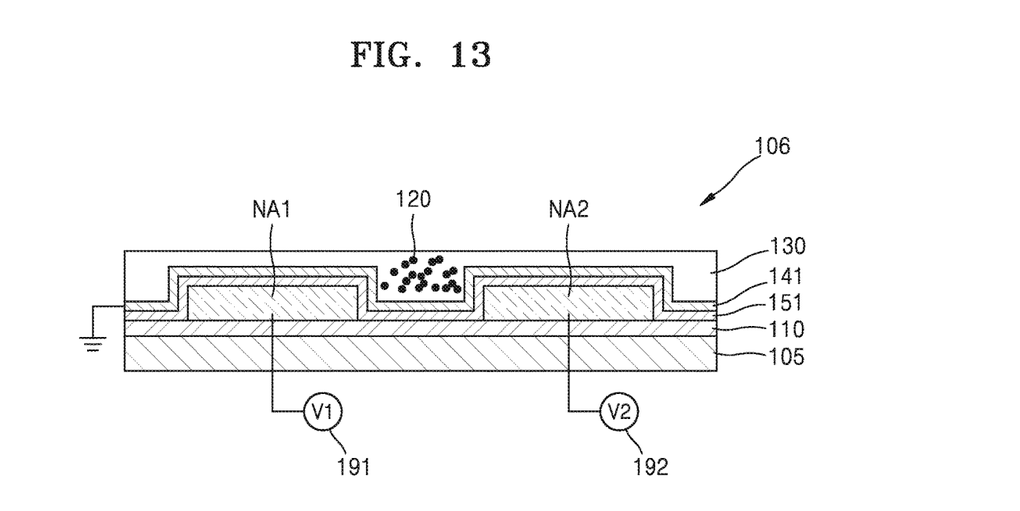
FIG. 13 is a cross-sectional view of a schematic structure of an optical modulating device according to another exemplary embodiment.

FIG. 13 is a cross-sectional view of a schematic structure of an optical modulating device 106 according to another exemplary embodiment.

The optical modulating device 106 includes a substrate 105, a plurality of nanoantennas NA1 and NA2 disposed on the substrate 105 to be adjacent to one another, a dielectric layer 151 disposed on the plurality of nanoantennas NA1 and NA2, a permittivity change layer 141 disposed on a dielectric layer 151 and having a variable permittivity, and the light-emitting structure 120 disposed on the permittivity change layer 141 between the plurality of nanoantennas NA1 and NA2.

The light-emitting structure 120 may include light-emitting particles and is embedded in the insulating material layer 130 on the permittivity change layer 140, as illustrated in FIG. 13.

The optical modulating device 106 further includes voltage appliers 191 and 192 for separately applying voltages between each of the plurality of nanoantennas NA1 and NA2, and the permittivity change layer 141. For example, the permittivity change layer 141 may be applied with a ground voltage, and a different voltage may be applied to each of the plurality of nanoantennas NA1 and NA2.

The light-emitting structure 120 disposed between the plurality of nanoantennas NA1 and NA2 may be coupled to a surface plasmon, in a respectively different coupling strength, based on the adjacent nanoantennas NA1 and NA2. An LDOS in the location of the light-emitting structure 120 may be determined by the combination of the coupling state.

Figure 14:
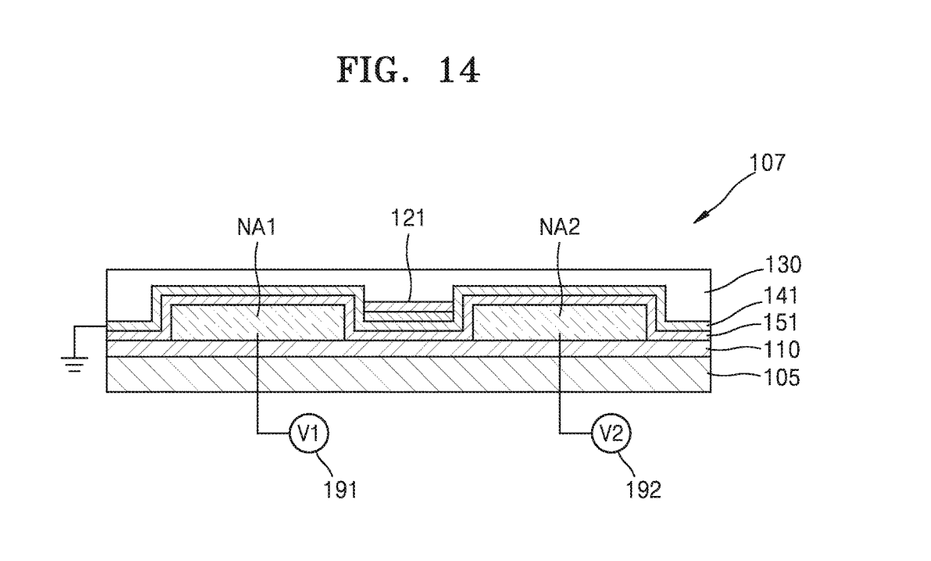
FIG. 14 is a cross-sectional view of a schematic structure of an optical modulating device according to another exemplary embodiment.

FIG. 14 is a cross-sectional view of a schematic structure of an optical modulating device 107 according to another exemplary embodiment.

The optical modulating device 107 differs from the optical modulating device 106 of FIG. 13 in that the optical modulating device 107 implements a PN junction structure as the light-emitting structure 121.

Figure 15:
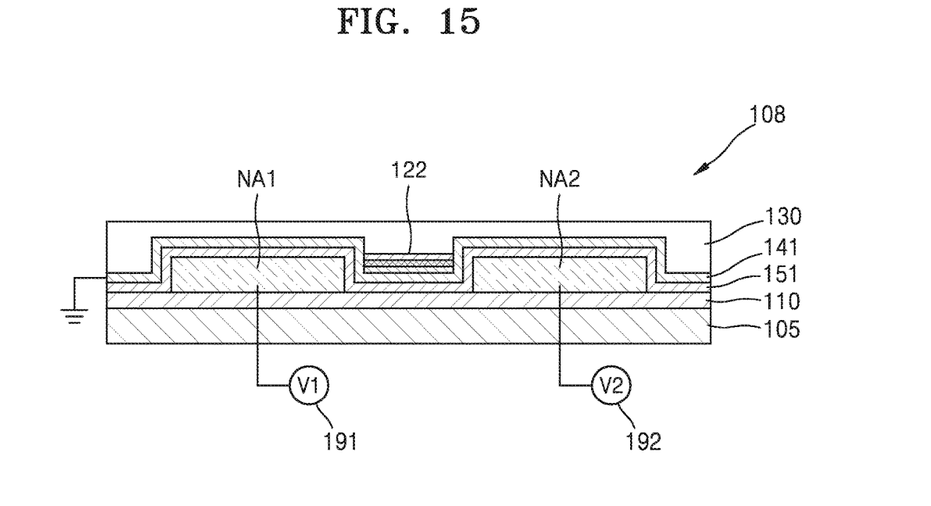
FIG. 15 is a cross-sectional view of a schematic structure of an optical modulating device according to another exemplary embodiment.

FIG. 15 is a cross-sectional view of a schematic structure of an optical modulating device 108 according to another exemplary embodiment.

The optical modulating device 108 differs from the optical modulating device 106 of FIG. 13 in that the optical modulating device 108 a semiconductor quantum well structure as the light-emitting structure 122.

Figure 16:
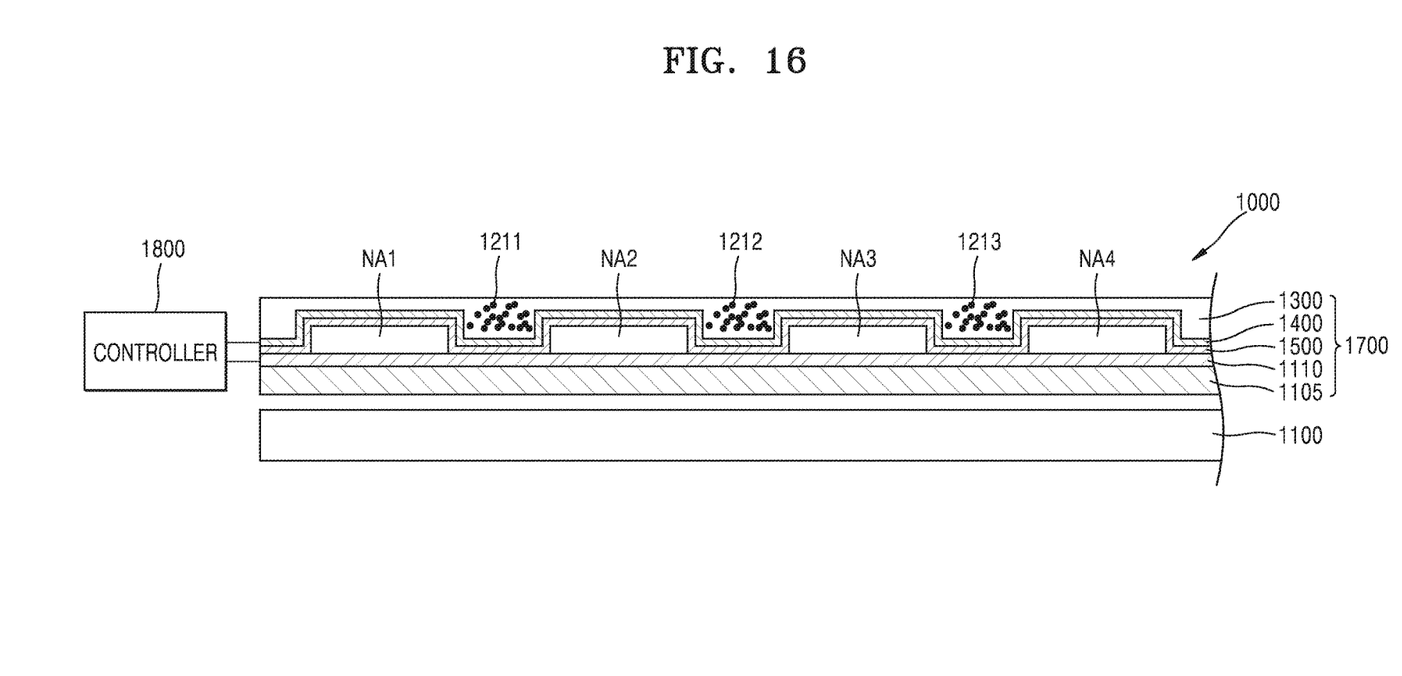
FIG. 16 is a cross-sectional view of a schematic structure of an optical apparatus according to an exemplary embodiment.

FIG. 16 is a cross-sectional view of a schematic structure of an optical apparatus 1000 according to an exemplary embodiment.

The optical apparatus 1000 includes a backlight 1100 and an optical modulating device 1700.

The optical modulating device 1700 includes a plurality of nanoantennas NA1, NA2, NA3, and NA4 disposed on a substrate 1105 to be apart from one another. The substrate 1105 may be a transparent substrate. Alternatively, the substrate 1105 may at least have a transparent characteristic with respect to light of a wavelength band provided by the backlight 1100.

A dielectric layer 1500 and a permittivity change layer 1400 are disposed on the plurality of nanoantennas NA1, NA2, NA3, and NA4. The dielectric layer 1500 and the permittivity change layer 1400 are formed along surfaces of the plurality of nanoantennas NA1, NA2, NA3, and NA4, and grooved areas may be formed between the plurality of nanoantennas NA1, NA2, NA3, and NA4. Light-emitting structures 1211, 1212, and 1213 are disposed in these grooved areas. The optical modulating device 1700 further includes an insulating material layer 1300 covering the dielectric change layer 1400, and the light-emitting structures 1211, 1212, and 1213 are embedded in the insulating material layer 1300. A driving circuit 1110 for controlling voltages applied to the plurality of nanoantennas NA1, NA2, NA3, and NA4, respectively, is further disposed on the substrate 1105.

The backlight 1100 provides light that is to be modulated in the optical modulating device 1700. The light provided by the backlight 1100 may supply optical energy to the light-emitting structures 1211, 1212, and 1213 provided in the optical modulating device 1700, and may generate an emitter. The backlight 1100 may provide ultraviolet light (UV) or light of a blue color. A light-emitting wavelength in the light-emitting structures 1211, 1212, and 1213 is greater than a wavelength of the light provided by the backlight 1100. Light-emitting power of the emitter generated in each of the light-emitting structures 1211, 1212, and 1213 is determined by an LDOS formed according to a change of permittivity of the permittivity change layer 1400 of the optical modulating device 1700. The change of permittivity may be controlled by an applied voltage.

The optical apparatus 1000 further includes a controller 1800 to separately control voltages applied between each of the plurality of nanoantennas NA1, NA2, NA3, and NA4 and the permittivity change layer 1400. Accordingly, the light-emitting structure 1211 between the nanoantennas NA1 and NA2, the light-emitting structure 1212 between the nanoantennas NA2 and NA3, and the light-emitting structure 1213 between the nanoantennas NA3 and NA4 may indicate different LDOSs and may serve as separate pixels that are separately controlled.

The optical apparatus 1000 may serve as a display apparatus. To this end, sizes and materials of light-emitting particles of the light-emitting structures 1211, 1212, and 1213 may be adjusted such that the light-emitting structures 1211, 1212, and 1213 emit light of different wavelengths. Depending on image information that is to be formed, the controller 1800 may control the voltages between each of the plurality of nanoantennas NA1, NA2, NA3, and NA4 and the permittivity change layer 1400 to control on/off of each of pixels to display the image. The image formed as such may have high color purity, and thus, may represent improved color gamut and high contrast.

The optical apparatus 1000 may be used not only as the display apparatus but also as other apparatuses. For example, the optical apparatus 1000 may be used as a beam deflector or a beam shaper by forming the plurality of nanoantennas NA1, NA2, NA3, and NA4 as shapes having different directionalities, or giving rules to voltages applied thereto.

The light-emitting structures 1211, 1212, and 1213 are illustrated as light-emitting particles. However, the light-emitting structures 1211, 1212, and 1213 are not limited thereto. The semiconductor PN junction structure or the semiconductor quantum well structure illustrated in FIGS. 14 and 15, respectively, may be implemented as the light-emitting structures 1211, 1212, and 1213. In addition, various materials and structures having photoluminescence may be used as the light-emitting structures 1211, 1212, and 1213.

It is illustrated that the optical modulating device 1700 of the optical apparatus 1000 is realized by arraying the structure of FIG. 13. However, it is not limited thereto. For example, the optical modulating device 1700 may be realized by repeatedly arraying the structure of FIG. 1. In this case, the shape of the backlight 1100 may be changed to be more appropriate for providing light to the light-emitting structures 1211, 1212, and 1213.

The optical modulating devices 100 through 108 and 1700 described above include a nanoantenna NA, a permittivity change layer, and a light-emitting structure, and may modulate incident light as various shapes by using an area in the permittivity change layer, in which a carrier concentration changes, as a gate.

Also, energy of the incident light is absorbed in the light-emitting structure of the optical modulating device so that light of different wavelengths may be emitted, and light-emitting energy may be controlled by adjusting a permittivity of the permittivity change layer.

The optical modulating devices 100 through 108 and 1700 may be miniaturized and high speed driving may be possible, and thus, the optical modulating devices 100 through 108 and 1700 may be applied to various optical apparatuses to improve the performance of the optical apparatuses.

The optical modulating devices 100 through 108 and 1700 may realize a display apparatus, together with a backlight, and may provide an image having miniaturized pixels and improved contrast.

The foregoing exemplary embodiments are examples and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An optical modulating device comprising:
   a permittivity change layer having a variable permittivity;
   a dielectric layer disposed on the permittivity change layer;
   a nanoantenna disposed on the dielectric layer; and
   a light-emitting structure disposed adjacent to the permittivity change layer, and configured to emit light having a greater wavelength than light incident on the light-emitting structure in response to the incident light, as an excitation source.

2. The optical modulating device of claim 1, wherein the light-emitting structure comprises light-emitting particles.

3. The optical modulating device of claim 2, further comprising an insulating material layer on which the permittivity change layer is disposed, the light-emitting particles being embedded in the insulating material layer.

4. The optical modulating device of claim 1, wherein the light-emitting structure comprises a semiconductor quantum well or a semiconductor PN junction.

5. The optical modulating device of claim 1, further comprising a metal layer on which the light-emitting structure, the permittivity change layer, the dielectric layer, and the nanoantenna are sequentially disposed.

6. The optical modulating device of claim 1, wherein the permittivity change layer comprises a transparent conductive oxide.

7. An optical apparatus comprising the optical modulating device of claim 1.

8. An optical modulating device comprising:
   a permittivity change layer having a variable permittivity;
   a dielectric layer disposed on the permittivity change layer;
   a nanoantenna disposed on the dielectric layer;
   a light-emitting structure disposed adjacent to the permittivity change layer; and
   a voltage-applier configured to apply a voltage between the permittivity change layer and the nanoantenna.

9. The optical modulating device of claim 8, wherein the permittivity change layer comprises an active area in which a carrier concentration changes based on the applied voltage.

10. An optical modulating device comprising:
    a substrate;
    nanoantennas disposed on the substrate and spaced apart from one another;
    a dielectric layer disposed on the nanoantennas;
    a permittivity change layer disposed on the dielectric layer and having a variable permittivity; and
    a light-emitting structure disposed on the permittivity change layer and between the nanoantennas.

11. The optical modulating device of claim 10, wherein the light-emitting structure is configured to emit light having a greater wavelength than light incident on the light-emitting structure in response to the incident light, as an excitation source.

12. The optical modulating device of claim 10, wherein the light-emitting structure comprises light-emitting particles.

13. The optical modulating device of claim 12, further comprising an insulating material layer disposed on the permittivity change layer, the light-emitting particles being embedded in the insulating material layer.

14. The optical modulating device of claim 10, wherein the light-emitting structure comprises a semiconductor quantum well or a semiconductor PN junction.

15. The optical modulating device of claim 10, further comprising an insulating material layer covering the permittivity change layer and the light-emitting structure.

16. The optical modulating device of claim 10, further comprising voltage-appliers configured to apply respective voltages between the respective nanoantennas and the permittivity change layer.

17. The optical modulating device of claim 10, wherein the permittivity change layer comprises a transparent conductive oxide.

18. An optical apparatus comprising:
the optical modulating device of claim 10; and
a backlight configured to provide light to the optical modulating device.

19. The optical apparatus of claim 18, further comprising a driving circuit disposed on the substrate and configured to control voltages applied to the respective nanoantennas.

20. An optical modulating device comprising:
a permittivity change layer having a variable permittivity;
a dielectric layer disposed on the permittivity change layer;
a light-emitting structure disposed adjacent to the permittivity change layer; and
a nanoantenna disposed on the dielectric layer, the nanoantenna comprising a conductive material and having a shape with a dimension of a sub-wavelength.

21. An optical modulating device comprising:
a permittivity change layer having a variable permittivity, the variable permittivity changing according to an electrical signal;
a dielectric layer disposed on the permittivity change layer;
a nanoantenna disposed on the dielectric layer; and
a light-emitting structure disposed adjacent to the permittivity change layer.

* * * * *